United States Patent
Johansson et al.

(10) Patent No.: US 6,239,475 B1
(45) Date of Patent: May 29, 2001

(54) VERTICAL BIPOLAR TRANSISTOR HAVING A FIELD SHIELD BETWEEN THE METALLIC INTERCONNECTING LAYER AND THE INSULATION OXIDE

(75) Inventors: Ted Johansson, Djursholm (SE); Larry Clifford Leighton, Santa Cruz, CA (US)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/524,782

(22) Filed: Mar. 13, 2000

Related U.S. Application Data

(62) Division of application No. 09/109,058, filed on Jul. 2, 1998, now Pat. No. 6,077,753.

(30) Foreign Application Priority Data

Jul. 4, 1997 (SE) .................................................. 9702598

(51) Int. Cl.[7] .................................................. H01L 23/58
(52) U.S. Cl. ......................... 257/488; 257/565; 257/578
(58) Field of Search ................................. 438/189, 192, 438/202–204, 212, 318, 322, 336, FOR 165, FOR 166; 257/488, 409, 565, 578, 584, 593, FOR 488, FOR 578

(56) References Cited

U.S. PATENT DOCUMENTS

| | | | |
|---|---|---|---|
| 3,302,076 | * 1/1967 | Ki Dong Kang et al. | 257/488 |
| 4,081,292 | * 3/1978 | Aoki et al. | 438/309 |
| 4,573,064 | * 2/1986 | Mclevige et al. | 257/198 |
| 4,864,379 | * 9/1989 | Schade, Jr. | 257/547 |
| 4,918,026 | * 4/1990 | Kosiak | 438/207 |
| 5,034,337 | * 7/1991 | Mosher et al. | 438/220 |
| 5,204,735 |   4/1993 | Yamamoto et al. | 257/528 |
| 5,343,052 | * 8/1994 | Oohata et al. | 257/141 |

(List continued on next page.)

FOREIGN PATENT DOCUMENTS

| | | | |
|---|---|---|---|
| 59-188970 | * | 10/1984 | (JP) . |
| 01216573 | * | 8/1989 | (JP) . |
| 01272155 | * | 10/1989 | (JP) . |
| 2-159727 |   | 6/1990 | (JP) . |
| 04072670 | * | 3/1992 | (JP) . |

OTHER PUBLICATIONS

Allison, "Silicon Bipolar Microwave Power Transistors," *IEEE Transactions on Microwave Theory and Techniques*, vol. 27, No. 5, May 1979, pp. 415–422.

Cooke, "Microwave Transistors: Theory and Design," *Proceedings of the IEEE*, vol. 59, No. 8, Aug. 1971, pp. 1163–1181.

PCT International Search Report.

*Primary Examiner*—Olik Chaudhuri
*Assistant Examiner*—Hoai Pham
(74) *Attorney, Agent, or Firm*—Burns, Doane, Swecker & Mathis, L.L.P.

(57) ABSTRACT

The present invention relates to a vertical bipolar power transistor primarily intended for radio frequency applications and to a method for manufacturing, the bipolar power transistor. The power transistor comprises a substrates, a collector layer of a first conductivity type on the substrate, a base of a second conductivity type electrically connected to the collector layer, an emitter of the first conductivity type electrically connected to the base, the base and the emitter each being electrically connected to a metallic interconnecting layer, the interconnecting layers being at least in parts separated from the collector layer by an insulation oxide. According to the invention the power transistor substantially comprises a field shield electrically connected to the emitter, and located between the metallic interconnecting layer of the base and the insulation oxide.

7 Claims, 2 Drawing Sheets

U.S. PATENT DOCUMENTS

| | | | |
|---|---|---|---|
| 5,373,183 | * 12/1994 | Beasom | 257/487 |
| 5,455,448 | * 10/1995 | Benjamin | 257/565 |
| 5,488,252 | 1/1996 | Johansson et al. | 257/579 |
| 5,501,992 | * 3/1996 | Nakamura | 438/367 |
| 5,606,195 | 2/1997 | Hooper et al. | 257/488 |
| 5,629,554 | 5/1997 | Maas et al. | 257/586 |

* cited by examiner

VERTICAL BIPOLAR TRANSISTOR HAVING A FIELD SHIELD BETWEEN THE METALLIC INTERCONNECTING LAYER AND THE INSULATION OXIDE

This application is a divisional of Application No. 09/109,058, filed Jul. 2, 1998 Pat. No. 6,077,753.

TECHNICAL FIELD

The present invention relates to a vertical bipolar power transistor and to a method of manufacturing a bipolar power transistor, said power transistors being primarily intended for high frequency applications, especially radio frequency applications.

STATE OF THE ART

Bipolar transistors for power amplification at high frequencies must, for a given supply voltage and operation frequency, fulfill a large number of detailed requirements concerning power amplification, ruggedness, breakdown voltage, noise, distortion, capacitance, input- and output impedance, etc. The operation frequencies for modern telecommunications electronics vary within the radio wave and microwave area. The requirements on the output power vary from a few watts to several hundred watts, where, in the latter case, several components connected in parallel in a casing may be used. Power transistors operate at high signal levels and high current densities. The computer tools currently available are not capable of simulating, in a detailed manner, the behaviour or performance in practical applications.

The semiconductor material most frequently used for power transistors, at least at frequencies below 3 GHz, is silicon. Also, because of the higher mobility of electrons compared to holes, primarily power transistor of npn type are used. The transistor structure is normally vertical, with the collector contact at the back of the silicon substrate. A collector layer is epitaxially deposited on the substrate, and field oxide can then be formed on top of the collector layer outside the active areas. The base and the emitter are formed through diffusion or ion implantation from the top down in the active areas of the epitaxial layer. Metallic interconnecting layers are formed higher up in the structure.

By varying the degree of doping in the collector, the base and/or the emitter, it is possible to obtain different types of frequency and breakdown characteristics. Different horizontal geometries give transistors with different current capacities.

The field oxide in transistors normally serves two purposes: isolation of components and reduction of parasitic capacitances to the substrate. For a bipolar power transistor normally no isolation of the components is needed, as the collector is constituted by the substrate. The purpose of the field oxide then becomes to isolate the metal layers from the substrate so that the parasitic capacitances between them are minimized.

One of the most critical parameters for power transistors at very high frequencies is the signal amplification. The signal amplification may be expressed as (see for example R. Allison, *Silicon bipolar microwave power transistors*, IEEE Trans. Microwave Theory and Techniques, Vol. MTT-27, No. 5, s 415, 1979):

$$G(f) \approx \frac{G_0}{\sqrt{1 + G_0^2 \left(\frac{f}{f_{max}}\right)^4}}$$

where $G_0$ is the so called beta value, that is the zero frequency amplification, f is the frequency and $f_{max}$ is the maximum oscillation frequency (for power amplification).

When the beta value and the frequency are high, that is, when $$G_0 \left(\frac{f}{f_{max}}\right)^4 \gg 1$$

the amplification G (f) may be written as $$G(f) \approx \left(\frac{f_{max}}{f}\right)^2 = \frac{f_T}{8\pi R_b C_{bc}} \frac{1}{f^2}$$

where $f_T$ is the maximum border frequency (for current amplification), $R_b$ is the base resistance and $C_{bc}$ is the base collector capacitance.

The three key factors for obtaining a high power amplification thus are maximum border frequency, minimum base resistance and minimum base collector capacitance. See also, for example, H. F. Cooke, *Microwave transistors: theory and design*, Proc. IEEE, Vol. 59, p. 1163, 1971.

By using polysilicon in the emitter, a higher cut-off frequency may be obtained without the base resistance becoming too high compared to an emitter that has only been ion implanted.

The base resistance may be reduced by reducing the vertical dimensions of the power transistor.

The base-collector capacitance consists of both junction capacitance and metal-substrate capacitance. The junction capacitance is determined by the degree of doping on the least doped side, that is, the collector side, and cannot be adjusted much because of the relation between collector doping and base-collector breakdown voltage.

The metal-substrate capacitance can, in ways known in the art, be reduced, both by increasing the thickness of the field oxide as pointed out above and also by minimizing the metal area.

The maximum practical field oxide thickness is achieved at approximately 2.5–3 µm, depending on the thermal budget, on junction leaks caused by mechanical stress and on limitations in the process integration. By using, for example, HIPOX (High Pressure Oxidation) a thicker oxide, approximately 3 µm thick, may be obtained in a shorter time, said thicker oxide fulfilling the requirements on the thermal budget. To avoid large differences in height in the obtained surface topography and facilitate further processing, a transistor having a thick field oxide may be manufactured by etching back the epitaxial collector layer by approximately half of the desired field oxide thickness outside the base and emitter areas, and then thermally oxidizing said etched back surfaces to obtain a substantially plane surface topography. An elevated area is, however, formed in the border area between the field oxide and the silicon, and this elevated area must be etched.

SUMMARY OF THE INVENTION

The object of the present invention is to obtain a vertical bipolar power transistor with high performance, especially improved amplification, said power transistor comprising a substrate, an epitaxial collector layer on said substrate, a base and an emitter formed in the epitaxial layer.

This is achieved by reducing the parasitic base metal-collector substrate capacitance, which is achieved according to the invention by introducing a field shield between, an interconnecting layer connected to the base and the field oxide, said field shield being electrically connected to the emitter.

The field shield is to be located in the passive area of the power transistor, that is, outside the component area.

The transistor can further preferably comprise a thick field oxide between the epitaxial collector layer and metallic interconnecting layers located above it.

It is feasible to manufacture the inventive bipolar power transistor by a deposition step, two masking steps, and two etching steps being added to a conventional process. The field shield is made by depositing an electrically conductive layer, followed by masking and etching. The electric connection to the emitter is achieved by the masking and etching of a contact hole in an isolating layer laying on the field shield, and subsequently filling said contact hole with a interconnecting layer connected to the emitter.

An advantage of the invention is that the amplifying characteristics of the power amplifier are significantly improved when an inventive field shield is introduced. The field shield reduces the base-collector capacitance at the expense of the base-emitter and the emitter-collector capacitance. The latter ones are less important as regards the amplifying characteristics of the power transistor.

The performance of the power amplifier is further improved when a thick field oxide is used in combination with the field shield.

BRIEF DESCRIPTION OF THE DRAWINGS

The invention will be described in more detail in the following, with reference to the appended drawings, which are only shown to illustrate the invention and shall not in any way be taken to limit the scope of the invention.

DETAILED DESCRIPTION OF EMBODIMENT

Figure 1A:
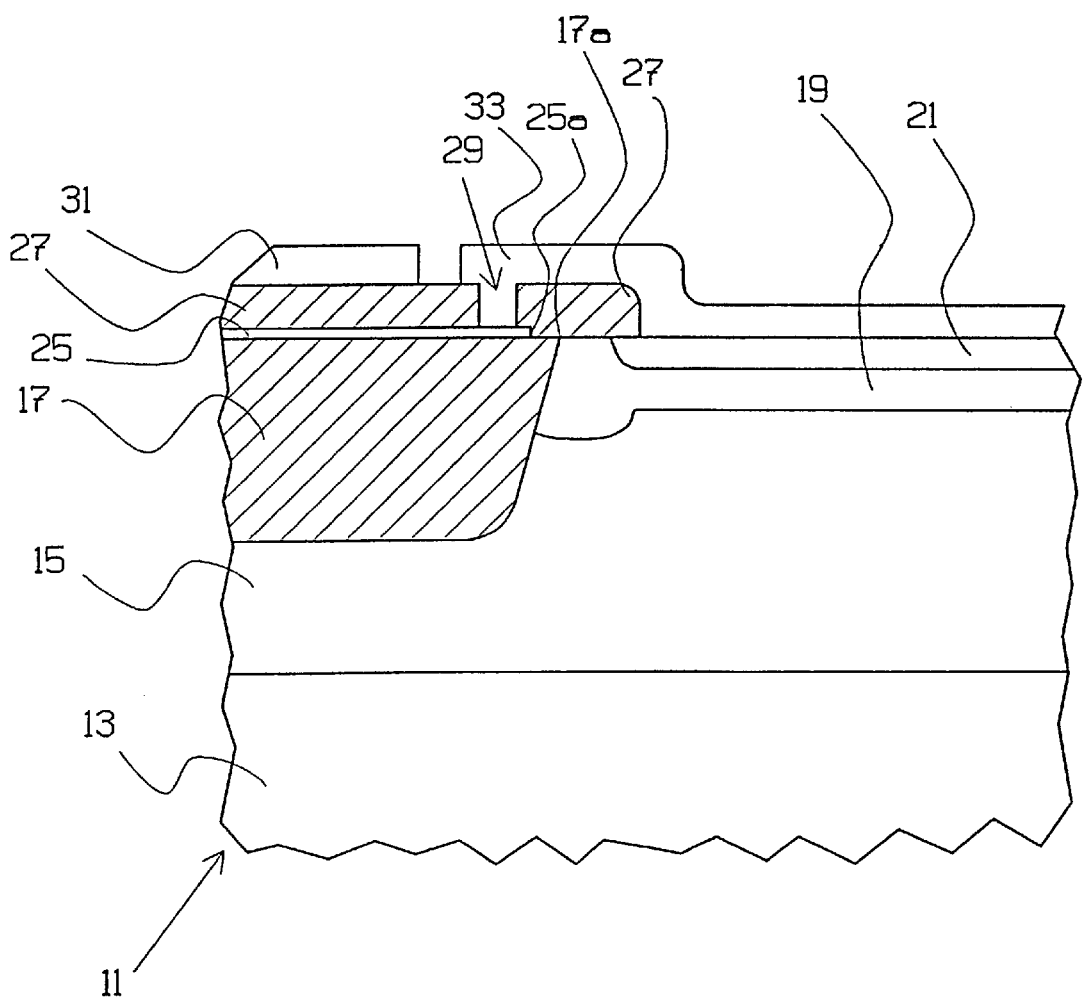
FIG. 1a shows a cross section of a detail of an inventive bipolar power transistor intended for high frequency applications.

In FIG. 1a reference numeral 11 denotes a detail of an inventive vertical bipolar power transistor intended for high frequency applications. The power transistor comprises a substrate 13 over which an epitaxial layer 15 is deposited. This layer 15, preferably n doped, constitutes the whole, or part of, the collector of the power transistor. The substrate 13 may be n doped and may also constitute part of the collector, collector contacts being created on the lower side of the substrate.

Alternatively, the substrate may be p doped or may be of a semi-insulating material, creating a subcollector between the substrate 13 and the epitaxial layer 15 and collector contacts on the upper side of the epitaxial layer. Such a "buried layer" embodiments is not shown in the figures.

In the epitaxial layer 15 a first p doped area 19, adjacent to the upper surface of the epitaxial layer, is formed, constituting the base of the power transistor. Also a second n doped area 21 adjacent to the upper surface of the epitaxial layer is formed in the first area 19. This second area 21 constitutes the emitter of the power transistor.

The base 19 and the emitter 21, respectively, are electrically connected to a first and a second metallic interconnecting layer 31, 33, respectively. In the cross section shown in FIG. 1a only the connection of the emitter to the interconnecting layer 33 is shown. The power transistor can laterally be of a so called interdigitated type, for example as disclosed in U.S. Pat. No. 5,488,252, of a so called mesh type or of a so called overlay type. All the above mentioned types are mentioned, for example, in the above mentioned reference by H. F. Cooke.

The metallic interconnecting layers 31, 33 are at least in parts separated from the epitaxial layer 15 by an insulation oxide 17, the edge 17a of which can be said to constitute a border between the active area of the transistor, that is, the area in which the active components are positioned, and the passive area of the transistor, that is the area in which the insulation oxide 17 is located and in which the main part of the insulating layer 27 of the base and the bonding pad of the base are found (not shown in FIG. 1a). Of course there is also a passive area on the emitter side with part of the emitter's interconnecting metal and the bonding pad of the emitter (not shown in FIG. 1a). The power transistor can also comprise an insulating layer 27 in parts over the insulation oxide 17.

According to the invention a field shield 25 is located between the first metallic interconnecting layer 31 and the insulation oxide 17. This field shield 25 should be electrically conductive, for example of n doped polysilicon or metal, and connected to the emitter 19 of the power transistor. This connection is achieved by etching at least one contact hole 29 in the insulating layer 27, said contact hole 29 being filled with the interconnecting metal 33 of the emitter.

In this way a base-collector capacitance is transformed to a base-emitter capacitance and an emitter-collector capacitance. These latter capacitances are less important as regards the effect on the amplifying properties of the power transistor.

The field shield according to the present invention in the lateral dimension is located in the above mentioned first passive area. In FIG. 1a the field shield 25 is shown with the edge 25a facing the active area clearly located in the passive area, that is, in FIG. 1a, to the left of the edge 17a of the insulation oxide.

Figure 1B:
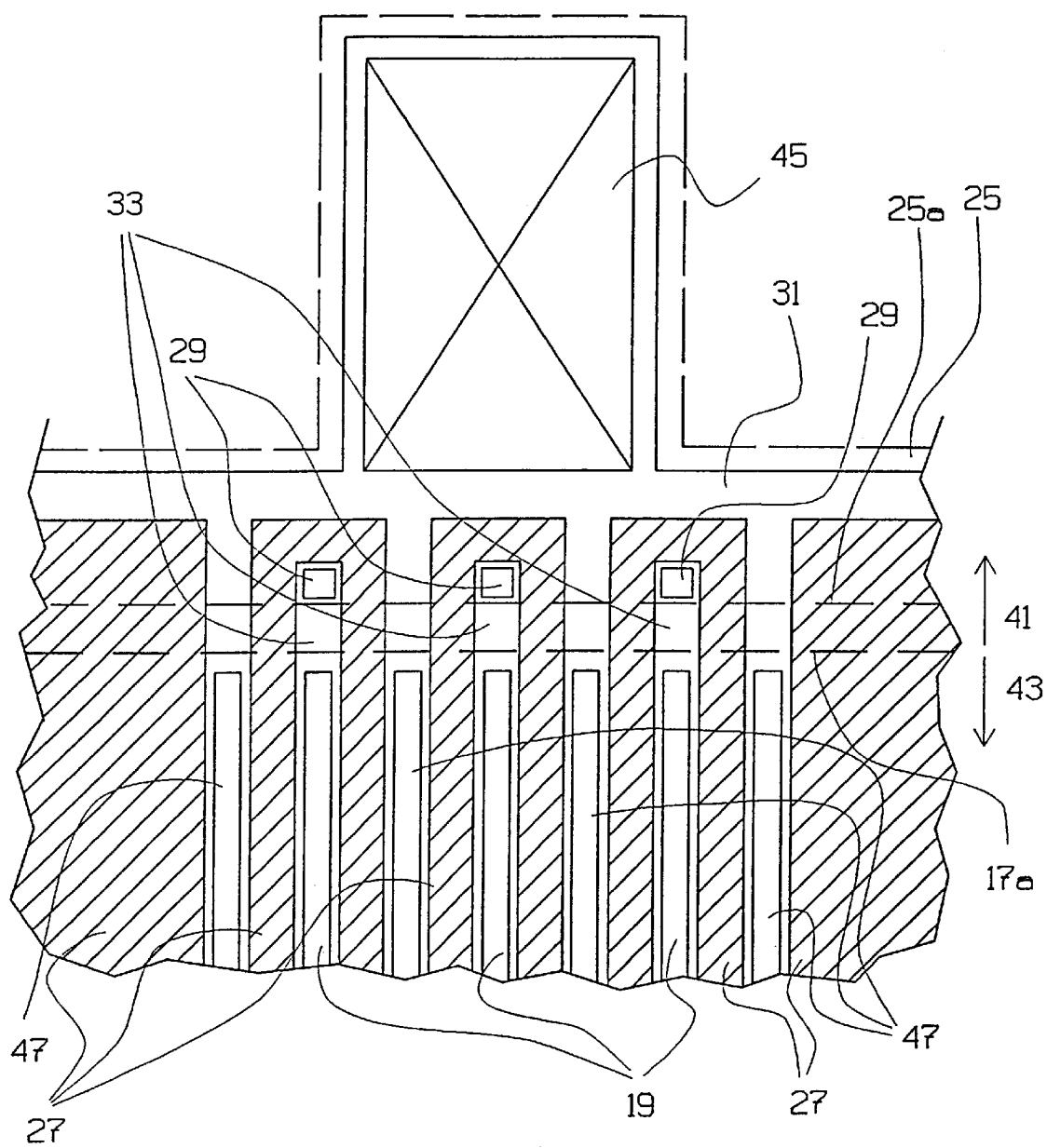
FIG. 1b shows a principal mask layout for the metallic interconnecting layer of a power transistor and a field shield according to the invention.

In FIG. 1b a principal mask layout for the metallic interconnecting layer 31, 33 of the power transistor is shown, in which the lateral extension of the field shield according to the invention is indicated 25. Here also the first passive area 41 is shown, comprising, among other things, the bonding pad 45 of the base and the area 43 with active components, respectively, such as emitter areas 21 and p+doped base contact areas 47, parts of which are shown in FIG. 1b. These areas 21, 47 are overlapped by the metallic interconnecting layers 31, 33.

The detail 11 shown in FIG. 1a is a cross section along one of the metallic emitter arms 33 shown in FIG. 1b.

Further, the edge 17a of the insulating oxide is indicated, as are three contact holes 29, which are etched in the insulating layer 27 and filled with metal from three metallic emitter arms, which in turn constitute part of the metallic interconnecting layer 33 of the emitter. The number of contact holes is preferably as high as the number of emitter areas 21 and the number of metallic emitter arms. A relatively large portion of the metallic interconnecting layer 31 of the base is also shown in FIG. 1b. Thus it is understood that large parts of the base metal—collector substrate capacitance is eliminated by the emitter connected field shield 25 according to the innovation.

Further actions that may be taken to decrease this capacitance according to the invention are using a thick insulating oxide 17, preferably having a thickness of at least approximately 2–3 µm. In this way the performance of the power transistor is further increased.

It is feasible to manufacture an inventive bipolar power transistor by adding one deposition step, two masking steps, and two etching steps to a conventional process.

On the doped, epitaxially deposited collector layer 15, traditionally a thin layer of an oxide is deposited, followed by a thin layer of a nitride (not shown in FIGS 1a or 1b). Through these thin layers ion implantation of the base 19 takes place, and subsequently, according to the invention, a silicon layer, preferably having a thickness of approximately 200–500 nm, is deposited. This silicon layer is relatively heavily doped, and then masked and etched back to obtain the inventive field shield 25. The doping may be performed either integrated in the conventional process simultaneously as the back of the structure is being doped or in a separate ion implantation. Alternatively the field shield 25 is manufactured in metal, in which case no doping is necessary. Masking and etching must take place in such a way as to place the field shield in the passive area of the power transistor, as shown in FIGS 1a and 1b.

A insulating layer, especially a TEOS layer, is then deposited, which is to be masked and etched to obtain the insulating layer 27 shown in FIG. 1a. This must, however, be done in two separate steps, since the etching of the inventive contact holes 29 is to stop at the silicon, while the conventional etching of emitter openings and base contact openings is to stop at the nitride. Preferably, the insulating layer is masked and etched first to obtain the contact holes 29 and then the masking and etching are performed to obtain the emitter openings and the base contact openings. The manufacturing process then continues in a conventional way.

A vertical bipolar power transistor according to the present invention is primarily intended for radio frequency applications, especially for use in an amplifier stage in a radio base station, but can also be used for, for example, cable TV and satellite telephony.

The amplification characteristics of the power transistor can be significantly improved by the introduction of an inventive field shield, which reduces the base-collector capacitance at the expense of the base-emitter and the emitter-collector capacitance.

The invention is, of course, not limited to the embodiments described above, and shown in the drawings, but may be modified within the scope of the appended claims. In particular, the invention is not limited by material, geometry or dimensions. The invention may, for example, be implemented in silicon as well as composite semiconductors, for example III–V semiconductors such as gallium arsenide. Also, the bipolar power transistor may of course be of pnp type.

What is claimed is:

1. A vertical bipolar power transistor, comprising:
   a substrate;
   a collector layer of a first conductivity type on the substrate;
   a base of a second conductivity type electrically connected to the collector layer;
   an emitter of said first conductivity type electrically connected to the base, said base and said emitter each being electrically connected to a metallic interconnecting layer and said metallic interconnecting layer at least in parts being separated from the collector layer by an insulation oxides; and
   a field shield located between the metallic interconnecting layer electrically connected to the base and the insulation oxide, and said field shield electrically connected to the emitter.

2. The vertical bipolar power transistor according to claim 1, wherein said field shield is located in the passive area of the power transistor, especially in the area above which the interconnecting layer electrically connected to the base and a bonding pad electrically connected to the base, are located.

3. The vertical bipolar power transistor according to claim 1 or 2, wherein said field shield is made primarily from silicon.

4. The vertical bipolar power transistor according to claim 1, wherein said field shield is doped to said first conductivity type.

5. The vertical bipolar power transistor according to claim 1, wherein said field shield is made of metal.

6. The vertical bipolar power transistor according to claim 1, wherein said vertical bipolar power transistor is of an interdigitated type.

7. The vertical bipolar power transistor of claim 1, wherein said vertical bipolar power transistor is made primarily from gallium arsenide.

\* \* \* \* \*